United States Patent
Sticksel et al.

(10) Patent No.: US 10,240,946 B2
(45) Date of Patent: Mar. 26, 2019

(54) ANGLE SENSOR

(71) Applicant: Continental Teves AG & Co. oHG, Frankfurt (DE)

(72) Inventors: Gerhard Sticksel, Gelnhausen-Haitz (DE); Manfred Goll, Glauburg (DE); Udo Hilgenberg, Frankfurt am Main (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 245 days.

(21) Appl. No.: 14/652,556

(22) PCT Filed: Dec. 17, 2013

(86) PCT No.: PCT/EP2013/076804
§ 371 (c)(1),
(2) Date: Jun. 16, 2015

(87) PCT Pub. No.: WO2014/095786
PCT Pub. Date: Jun. 26, 2014

(65) Prior Publication Data
US 2015/0338242 A1 Nov. 26, 2015

(30) Foreign Application Priority Data
Dec. 20, 2012 (DE) .................. 10 2012 224 108
Sep. 20, 2013 (DE) .................. 10 2013 219 018

(51) Int. Cl.
*G01D 5/14* (2006.01)
*G01D 5/12* (2006.01)
(Continued)

(52) U.S. Cl.
CPC ................. *G01D 5/12* (2013.01); *G01B 7/30* (2013.01); *G01D 5/142* (2013.01); *G01D 5/145* (2013.01);
(Continued)

(58) Field of Classification Search
CPC ............. G01D 5/145; G01D 5/12; G01B 7/30
See application file for complete search history.

(56) References Cited

U.S. PATENT DOCUMENTS 6,316,935 B1 * 11/2001 Vanzuilen .............. G01D 5/145
324/207.21
8,575,924 B2  11/2013 Gruber et al.
(Continued)

FOREIGN PATENT DOCUMENTS

DE  3834649 A1  4/1990
DE  19733719 C1  4/1999
(Continued)

OTHER PUBLICATIONS

German Search Report for German Application No. 10 2013 219 018.2 dated Jan. 22, 2014, including partial translation.
(Continued)

*Primary Examiner* — Alesa Allgood
(74) *Attorney, Agent, or Firm* — RatnerPrestia

(57) ABSTRACT

An angle sensor for detecting a rotational angle on the basis of a relative angular position of a physical field. The sensor includes a first sensor element and a second sensor element, between which elements the physical field can be transmitted. The first sensor element includes a blind hole in which the second sensor element is rotatably mounted.

9 Claims, 3 Drawing Sheets

(51) Int. Cl.
   *G01R 33/00* (2006.01)
   *G01B 7/30* (2006.01)
   *G01D 11/24* (2006.01)
   *G01P 3/487* (2006.01)

(52) U.S. Cl.
   CPC ............ *G01D 11/245* (2013.01); *G01P 3/487* (2013.01); *G01R 33/0052* (2013.01)

(56) References Cited

U.S. PATENT DOCUMENTS

| | | | |
|---|---|---|---|
| 2005/0245103 A1* | 11/2005 | Ellison | G02B 6/4201 439/61 |
| 2006/0273784 A1 | 12/2006 | Godoy et al. | |
| 2006/0274485 A1 | 12/2006 | Godoy et al. | |
| 2009/0213204 A1* | 8/2009 | Wong | H04N 7/142 348/14.02 |

FOREIGN PATENT DOCUMENTS

| | | |
|---|---|---|
| DE | 102005060173 | 7/2006 |
| DE | 202007010280 U1 | 9/2007 |
| DE | 102007034099 | 1/2009 |
| DE | 102007060604 A1 | 6/2009 |
| DE | 10122542 | 12/2009 |
| DE | 102011118775 | 4/2013 |
| DE | 102011118773 | 5/2013 |
| EP | 0617260 | 9/1994 |
| EP | 0943469 A2 | 9/1999 |
| EP | 1059512 | 12/2000 |
| EP | 1729093 A2 | 12/2006 |
| EP | 1729094 | 12/2006 |
| WO | 2006029946 | 3/2006 |

OTHER PUBLICATIONS

International Search Report for International Application No. PCT/EP2013/076804 dated Jun. 25, 2014.
European Communication for European Application No. 13 808 001.5, dated May 8, 2017, 6 pages.
Chinese Office Action for Chinese Application No. 201380073354.2, dated Mar. 8, 2018, 6 pages.
Extended European Search Report for European Application No. 17 198 235.8, dated Feb. 28, 2018, including partial English translation, 7 pages.

* cited by examiner

ANGLE SENSOR

CROSS REFERENCE TO RELATED APPLICATIONS

This application is the U.S. National Phase Application of PCT/EP2013/076804, filed Dec. 17, 2013, which claims priority to German Patent Application Nos. 10 2012 224 108.6, filed Dec. 20, 2012 and 10 2013 219 018.2, filed Sep. 20, 2013, the contents of such applications being incorporated by reference herein.

FIELD OF THE INVENTION

The invention relates to an angle sensor and to a method for producing the angle sensor.

BACKGROUND OF THE INVENTION

WO 2006/029946A1, which is incorporated by reference, discloses an angle sensor having a transmitter magnet and a measuring circuit with evaluation electronics for evaluating an angular position of the transmitter magnet. The transmitter magnet does not have a direct mechanical connection to the measuring circuit, with the result that the transmitter magnet floats above the measuring circuit from the point of view of the evaluation electronics.

SUMMARY OF THE INVENTION

An aspect of the invention aims to improve the known angle sensor.

According to one aspect of the invention, an angle sensor for detecting a rotational angle on the basis of a relative angular position of a physical field comprises a first sensor element and a second sensor element, between which the physical field can be transmitted, the first sensor element comprising a blind hole in which the second sensor element is rotatably mounted.

The stated angle sensor is based on the consideration that it could be used on a vehicle for the purpose of detecting a relative position between a wheel of the vehicle and its chassis. This could implement an active chassis control system which could be used to further resolve the conventional conflict of objectives between sporty and comfortable chassis tuning.

However, it is shown here that such sensors are very susceptible to faults and therefore have a comparatively short service life. In the context of the stated angle sensor, it is recognized in this case that a main cause of the short service life is moisture which penetrates the angle sensor, damages the evaluation circuit of the angle sensor and renders it inoperative. This moisture which enters is the cause of the angle sensor fitted to the underside of the vehicle being directly exposed to dirt and moisture stirred up from the road.

Therefore, the stated angle sensor is based on the idea of protecting said sensor and, in particular, its evaluation circuit from penetrating moisture. This is achieved by virtue of the fact that the sensor is divided into two sensor elements, between which the physical field for transmitting the rotational angle information is interchanged. In this case, one of the two sensor elements is designed with a blind hole into which the other sensor element is axially inserted and is therefore rotatably accommodated therein. Although the moisture mentioned above could penetrate the blind hole here, the blind hole itself isolates an interior of the corresponding sensor element, in which the blind hole is formed, from the moisture, with the result that the moisture cannot penetrate the interior. A component of the rotational angle sensor accommodated in this sensor element, for example an evaluation circuit or a transmitter element, would therefore be completely protected from the penetrating moisture, with the result that failure of the angle sensor for this reason can be excluded.

In one development, the stated angle sensor comprises a transmitter element which is fastened in the second sensor element in a stationary manner and is intended to emit the physical field. This physical field is preferably a magnetic field because the latter can pass through common housing materials such as plastic or metal and can therefore be received in the first sensor element. In this case, the second sensor element itself may comprise a rotationally symmetrical housing which accommodates the transmitter element, the rotationally symmetrical housing being able to rotate in the above-mentioned blind hole.

In one additional development, the stated angle sensor comprises an evaluation circuit which is fastened in the first sensor element in a stationary manner and is intended to receive the physical field and to determine an output signal dependent on the rotational angle on the basis of the physical field. This evaluation circuit would be protected from weathering effects as a result of being accommodated in the first sensor element on account of the above-mentioned hermetic seal with respect to the penetrating moisture. However, the evaluation circuit could also be arranged in the second sensor element in principle, in which case the above-mentioned transmitter element should then be arranged in the first sensor element.

In another development of the stated angle sensor, the second sensor element is axially mounted in the blind hole in the first sensor element. This makes it possible to prevent the second sensor element from axially moving with respect to the first sensor element and to prevent an axial distance between the evaluation circuit and the transmitter element from increasing in size, which would primarily result in attenuation of the physical field, such as the magnetic field, arriving at the evaluation circuit and therefore in impairment of the measuring conditions. In the worst-case scenario, even the second sensor element could fall out of the first sensor element.

In one particular development of the stated angle sensor, the first sensor element consists of a material which differs from the second sensor element. In this manner, different running properties between the two sensor elements such as resistance to abrasion and running noises can be adapted to the conditions of use, for example in the above-mentioned vehicle.

In one preferred development of the stated angle sensor, the material of at least one of the sensor elements is filled with an additive. In the context of this additive, the properties such as wear resistance, running noises and so on at the interface between the two sensor elements can be adapted to the operating conditions.

In this case, the additive can be set up to reduce a coefficient of friction at the interface between the two sensor elements. Polytetrafluoroethylene which is known under the trade name Teflon could be used as the additive, for example.

In one particularly preferred development of the stated angle sensor, the materials are selected in such a manner that an interface between the two sensors has low friction. Because the two sensor elements move inside one another with low friction, signs of wear such as abrasion can be minimized. Furthermore, other criteria, for example self-lubrication, can also be concomitantly considered when choosing the materials.

According to another aspect of the invention, a method for producing one of the stated angle sensors comprises the steps of providing the second sensor element, and injection-molding the second sensor element with a material in order to form a housing for the first sensor element. This makes it possible to produce the stated angle sensor in a particularly favorable manner.

In one development of the stated method, a release agent is applied to the second sensor element before injection-molding the second sensor element. This release agent may be, for example, a liquid mold release agent or a solid release agent such as a varnish. The release agent could be used not only to keep the two sensor elements separate from one another after the injection-molding but also to reduce the friction between the two sensor elements during operation.

BRIEF DESCRIPTION OF THE DRAWINGS

The above-described properties, features and advantages of this invention and the manner in which they are achieved become clearer and more clearly comprehensible in connection with the following description of the exemplary embodiments which are explained in more detail in connection with the drawings, in which.

DETAILED DESCRIPTION OF THE INVENTION

In the figures, identical technical elements are provided with identical reference symbols and are described only once.

Figure 1:
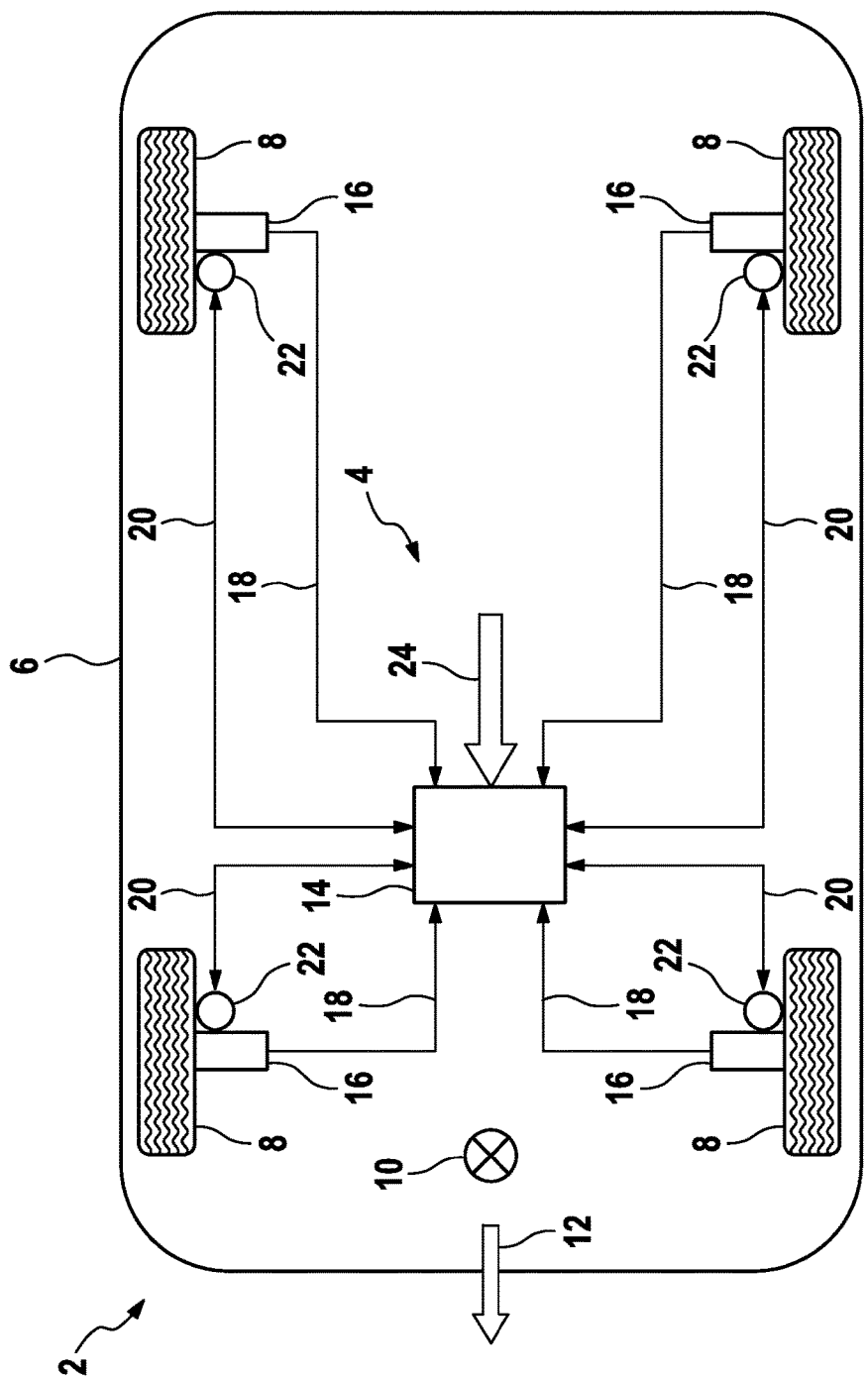
FIG. 1 shows a schematic view of a vehicle having a chassis control system.

Reference is made to FIG. 1 which shows a schematic view of a vehicle 2 having a chassis control system 4.

Within the scope of this chassis control system 4, lifting, pitching and rolling movements of a chassis 6 with respect to a road (not illustrated any further), on which wheels 8 of the vehicle 2 roll in a stationary manner in a vertical axis 10, are intended to be minimized in order to improve the driving properties of the vehicle 2 when driving in a direction of travel 12.

For this purpose, in a manner known from DE 10 2005 060 173 A1, which is incorporated by reference, for example, the chassis control system has a control apparatus 14 which, in the present embodiment, receives rotational angles 18 from angle sensors 16 arranged on each wheel 8, which rotational angles describe a relative position of the corresponding wheel 8 with respect to the chassis 6. On the basis of the differences between these rotational angles 18, the control apparatus 14 determines whether the chassis 6 is moving in the vertical axis 10, that is to say is carrying out a lifting movement, or whether the chassis 6 is rolling or pitching and controls the chassis. In this case, the control apparatus 14 calculates a countermovement which counteracts this lifting, rolling and/or pitching movement and uses suitable control signals 20 to control active spring struts 22 arranged on the wheels 8 in order to compensate for this countermovement using the chassis 6. The spring struts known from DE 101 22 542 B4, which is incorporated by reference, for example, can be used as the active spring struts 22.

In order to take into account lifting, rolling and/or pitching movements caused by the road holding, for example during cornering, a suitable desired value 24 can be supplied to the control apparatus.

Figure 2:
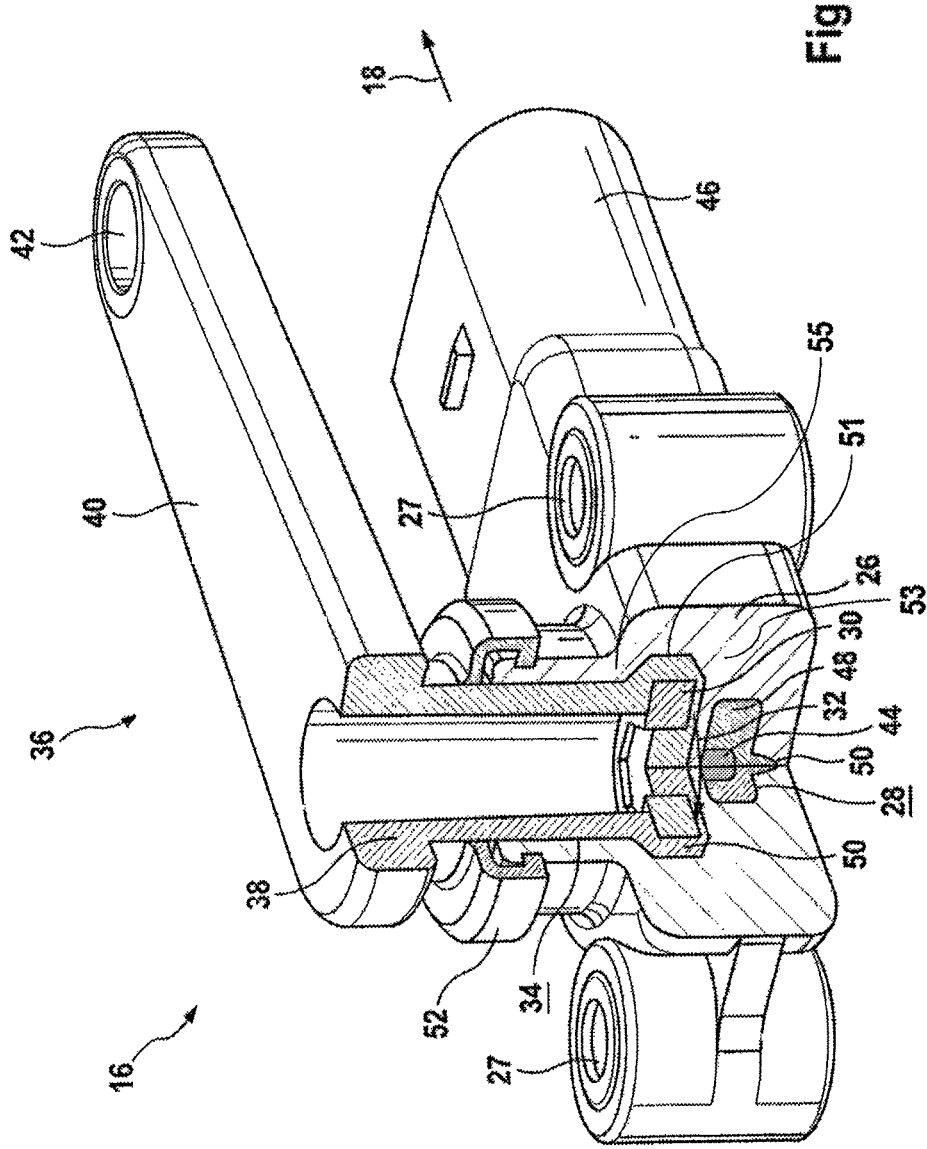
FIG. 2 shows an angle sensor for detecting an acceleration between a wheel and a chassis in the vehicle from FIG. 1.

Reference is made to FIG. 2 which shows an example of an angle sensor 16 from FIG. 1.

In the present embodiment, the angle sensor 16 has a first sensor element in the form of a circuit housing 26 which can be connected to the chassis 6 in a stationary manner in the vertical axis 10. For this purpose, fastening holes 27 are formed on the circuit housing 26, through which a fastening means (not shown in any more detail), for example a screw, can be passed. The circuit housing 26 houses an evaluation circuit 28 which receives a physical field in the form of a magnetic field 32 from a transmitter element (yet to be described) in the form of a magnet 30. A second sensor element 36 in the form of a transmitter housing 38, which houses the magnet 30 at one axial end, is rotatably accommodated in a blind hole 34 in the circuit housing 26. A lever 40 projects at right angles from the axial end of the transmitter housing 38 which is opposite the magnet 30, a fastening hole 42, at which the angle sensor 16 can be connected to one of the wheels 8 in a stationary manner in the vertical axis 10, being formed at the radial end of said lever.

If the corresponding wheel 8 moves with respect to the chassis 6 in the vertical axis 10, the wheel 8 also moves the lever 40 and therefore rotates the transmitter housing 38 with respect to the circuit housing 26 at the rotational angle 18 to be transmitted. The magnetic field 32 therefore also moves with respect to the evaluation circuit 28 at the rotational angle 18, which can be detected by said circuit by means of metrology, for example using a Hall element 44 which is known per se in the evaluation circuit 28, and can be transmitted to the control apparatus 14 in the manner shown in FIG. 1 in an output signal (not illustrated any further) bearing the rotational angle 18 at an output interface 46.

In the present embodiment, the Hall element 44 in the evaluation circuit 28 is housed, together with further elements (not illustrated), for example a signal evaluation chip, in a protective compound 48. The evaluation circuit 48 itself as well as further components, for example a signal cable (not illustrated any further) for transmitting the above output signal to the output interface 46, are then housed in the circuit housing 26 which is molded around the transmitter housing 38 in the present embodiment. In this respect, the transmitter housing 38, the evaluation circuit 28 and all possibly further elements to be accommodated in the circuit housing 26, for example sockets forming the fastening holes 27, are accommodated in a mold (not illustrated any further) and are injection-molded with a compound forming the circuit housing 26, for example a plastic. In this manner, the circuit housing 26 is automatically formed with the blind hole 34. In this case, the compound 26 forming the circuit housing 26 is injection-molded around the transmitter housing 38 in a hot state, in which case a gap (not referenced any further) is formed in the blind hole 34 between the circuit housing 26 and the transmitter housing 38 on account of shrinkage during cooling and/or hardening of the circuit housing 26. This gap results in play between the transmitter housing 38 and the circuit housing 26, on account of which the transmitter housing 38 can rotate in the circuit housing 26. So that the evaluation circuit 28 can be held in the mold when producing the circuit housing 26, a mold holder 50 is formed thereon.

In order to also axially hold the transmitter housing 38 in the circuit housing 26, a radial bead 50 which axially fixes the transmitter housing 38 in the circuit housing 26 is formed at that axial end of the transmitter housing 38 which is opposite the lever 40. The radial bead 50 forms a radial projection 51, with a first housing portion 53 positioned below radial projection 51 and a second housing portion 55 positioned above radial projection 51. This forms a constant air gap between the magnet 30 and the evaluation circuit 28, which air gap allows the rotational angle 18 to be permanently precisely evaluated on the basis of the magnetic field 32.

A plastic, for example, can be used as the material for the circuit housing 26, whereas a metal or likewise a plastic can be used as the material for the transmitter housing 38.

The above-mentioned gap between the transmitter housing and the circuit housing 26 can be sealed using a sealing ring 52 in the present embodiment.

Figure 3:
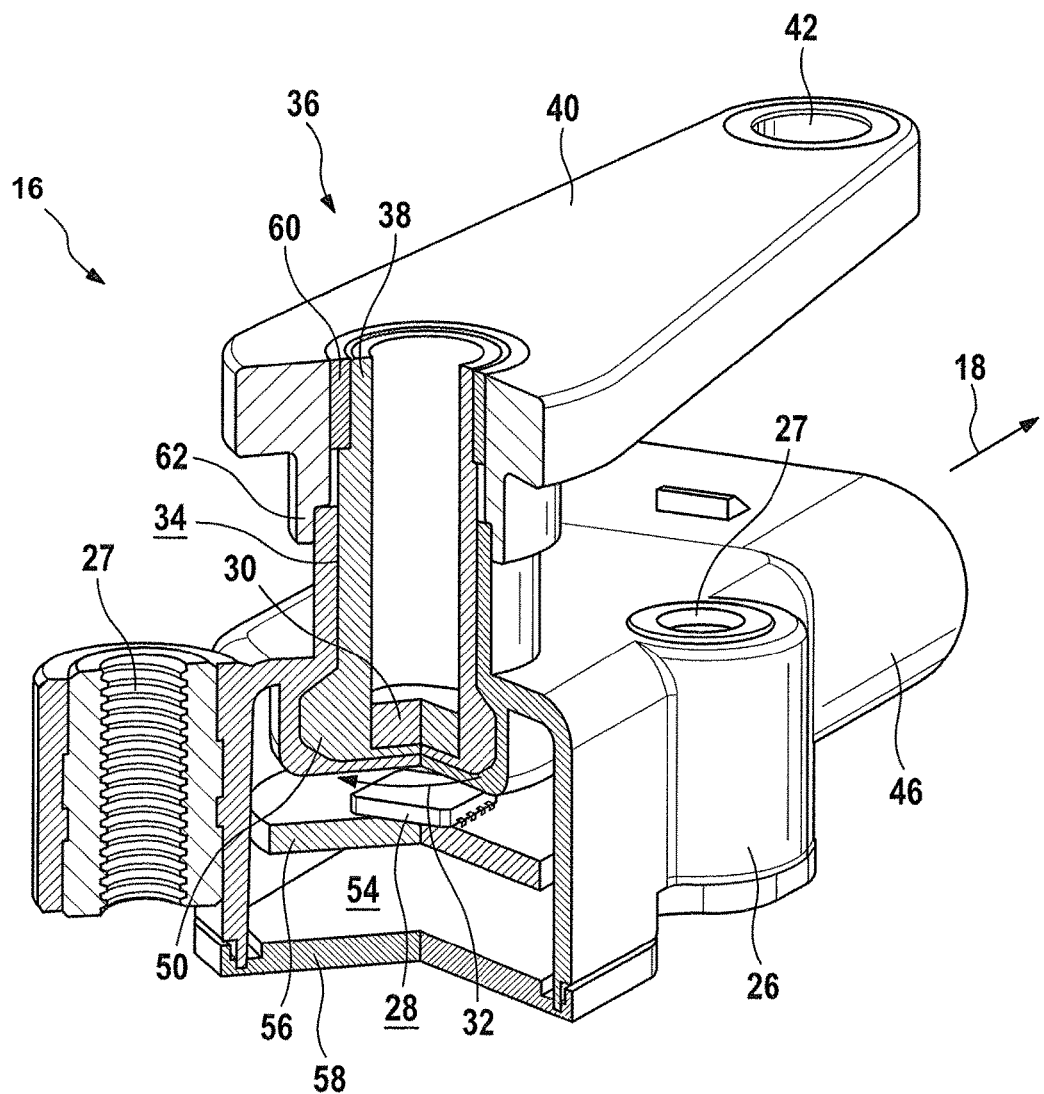
FIG. 3 shows an alternative angle sensor for detecting an acceleration between a wheel and a chassis in the vehicle from FIG. 1.

FIG. 3 shows an alternative angle sensor 16 which is substantially based on the angle sensor 16 in FIG. 2. Therefore, only the differences between the angle sensor 16 in FIG. 2 and the angle sensor 16 in FIG. 3 are described below.

In contrast to the angle sensor 16 in FIG. 2, an interior 54 of the circuit housing 26 is first of all formed, for example by means of injection-molding, when producing the circuit housing 26 of the angle sensor 16 in FIG. 3. In this case, a mold forming the interior 54 is arranged, together with the transmitter housing 38 and the sockets 27 which may have an internal thread (not referenced any further) in the present embodiment, in the above-mentioned mold and is injection-molded with the material forming the circuit housing 26 in the above-mentioned manner. A supporting base 56 carrying the evaluation circuit 28 is then inserted into the interior 54 in such a manner that the evaluation circuit 28 is arranged with a particular air gap with respect to the magnet 30 and is fastened in the circuit housing 26. The interior 54 is finally closed with a cover 58.

In the present embodiment, the lever 40 is not fastened to the transmitter housing 38 in one piece but rather is fastened to the latter via a clamping sleeve 60 using a press fit. In this case, a sealing sleeve 62 which radially projects beyond the circuit housing 26 in a predetermined region is formed on the lever 40. This also makes it possible to dispense with the optional sealing element 52 in FIG. 3.

The invention claimed is:

1. An angle sensor for detecting a rotational angle on the basis of a relative angular position of a physical field, comprising:
   a first sensor element comprising (i) a housing defining a blind hole extending along an axis and (ii) a circuit positioned within the housing; and
   a second sensor element, the second sensor element comprising a radial projection extending in a radial direction relative to the axis of the blind hole, the radial projection mounted in the blind hole so as to be rotatable around the axis,
   wherein the housing is formed from a continuous piece of material having a first portion positioned between the second sensor element and the circuit to limit axial movement of the second sensor element toward the circuit, and a second portion positioned overtop the radial projection to limit axial movement of the second sensor element away from the circuit.

2. The angle sensor as claimed in claim 1, wherein the circuit is fastened in the first sensor element in a stationary manner and is configured to receive the physical field and to determine an output signal dependent on the rotational angle on the basis of the physical field.

3. The angle sensor as claimed in claim 1, the second sensor element being axially mounted in the blind hole in the first sensor element.

4. The angle sensor as claimed in claim 1, comprising a transmitter element which is fastened in the second sensor element in a stationary manner and is configured to emit the physical field.

5. The angle sensor as claimed in claim 4, wherein the circuit is fastened in the first sensor element in a stationary manner and is configured to receive the physical field and to determine an output signal dependent on the rotational angle on the basis of the physical field.

6. The angle sensor as claimed in claim 1, the first sensor element consisting of a material which differs from the second sensor element.

7. The angle sensor as claimed in claim 6, the materials being selected in such a manner that an interface between the two sensor elements has low friction.

8. The angle sensor as claimed in claim 6, the material of at least one of the sensor elements comprising an additive.

9. The angle sensor as claimed in claim 8, the additive being set up to reduce a coefficient of friction at the interface between the two sensor elements.

* * * * *